US009780328B2

(12) United States Patent
Hong et al.

(10) Patent No.: US 9,780,328 B2
(45) Date of Patent: Oct. 3, 2017

(54) ORGANIC LIGHT-EMITTING DISPLAY APPARATUS

(71) Applicant: SAMSUNG DISPLAY CO., LTD., Yongin-si, Gyeonggi-Do (KR)

(72) Inventors: Sang-Min Hong, Yongin-si (KR); Hyun-Min Hwang, Yongin-si (KR); Hyun-Young Kim, Yongin-si (KR); Eun-Jae Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/987,757

(22) Filed: Jan. 5, 2016

(65) Prior Publication Data

US 2016/0118618 A1 Apr. 28, 2016

Related U.S. Application Data

(63) Continuation of application No. 14/328,338, filed on Jul. 10, 2014, now Pat. No. 9,276,054.

(30) Foreign Application Priority Data

Feb. 19, 2014 (KR) .................. 10-2014-0019222

(51) Int. Cl.
*H01L 51/52* (2006.01)
*H01L 27/32* (2006.01)

(52) U.S. Cl.
CPC ...... *H01L 51/5246* (2013.01); *H01L 27/3246* (2013.01); *H01L 27/3248* (2013.01); *H01L 27/3258* (2013.01); *H01L 27/3276* (2013.01)

(58) Field of Classification Search
CPC ............. H01L 51/5246; H01L 27/3246; H01L 27/3258; H01L 27/3248; H01L 27/3276
See application file for complete search history.

(56) References Cited

U.S. PATENT DOCUMENTS

| 6,858,898 | B1 | 2/2005 | Hayakawa et al. |
| 6,876,145 | B1 | 4/2005 | Yamazaki et al. |
| 8,154,198 | B2 | 4/2012 | Lee et al. |
| 8,552,642 | B2 | 10/2013 | Logunov et al. |
| 2002/0104995 | A1* | 8/2002 | Yamazaki ........... H01L 27/3246 257/72 |
| 2007/0046178 | A1 | 3/2007 | Imai et al. |
| 2009/0102369 | A1 | 4/2009 | Nakanishi et al. |

(Continued)

FOREIGN PATENT DOCUMENTS

JP 2003-317934 A 11/2003
KR 10-2010-0022738 A 3/2010

(Continued)

*Primary Examiner* — Donald Raleigh
*Assistant Examiner* — Kevin Quarterman
(74) *Attorney, Agent, or Firm* — Lewis Roca Rothgerber Christie LLP

(57) ABSTRACT

An organic light-emitting display apparatus includes a first substrate, a display unit defining an active area on the first substrate and including an insulating layer, a second substrate on the display unit, one or more signal lines outside the active area and on the insulating layer, and a sealant between the first substrate and the second substrate. The sealant bonds the first substrate and the second substrate, and covers at least a portion of the signal lines.

14 Claims, 5 Drawing Sheets

(56) References Cited

U.S. PATENT DOCUMENTS

| | | |
|---|---|---|
| 2010/0044692 A1 | 2/2010 | Kim et al. |
| 2011/0057208 A1 | 3/2011 | Jeon et al. |
| 2012/0235557 A1 | 9/2012 | Lee |
| 2013/0001533 A1 | 1/2013 | Kim et al. |
| 2013/0049003 A1 | 2/2013 | Choi et al. |
| 2013/0049062 A1* | 2/2013 | Hatano .................. H01L 21/50 257/99 |

FOREIGN PATENT DOCUMENTS

| | | |
|---|---|---|
| KR | 10-2010-0047585 A | 5/2010 |
| KR | 10-2010-0105642 A | 9/2010 |
| KR | 10-2011-0020613 A | 3/2011 |
| KR | 10-2011-0027115 A | 3/2011 |
| KR | 10-2012-0105252 A | 9/2012 |
| KR | 10-2013-0007006 A | 1/2013 |
| KR | 10-2013-0023099 A | 3/2013 |

* cited by examiner

ORGANIC LIGHT-EMITTING DISPLAY APPARATUS

CROSS-REFERENCE TO RELATED APPLICATIONS

This application is a continuation of U.S. patent application Ser. No. 14/328,338, filed on Jul. 10, 2014, which claims priority to and the benefit of Korean Patent Application No. 10-2014-0019222, filed on Feb. 19, 2014 in the Korean Intellectual Property Office, the entire contents of all of which are herein incorporated by reference.

BACKGROUND

1. Field

Aspects of embodiments of the present invention relate to an organic light-emitting display apparatus.

2. Description of the Related Art

In general, a display apparatus such as an organic light-emitting display apparatus including a thin film transistor (TFT) has been spotlighted because the display apparatus can be variously applied to a mobile display device such as a smartphone, a tablet personal computer (PC), an ultra-thin laptop, a digital camera, a video camera, or a personal digital assistant (PDA), or to an electric/electronic product such as an ultra-thin television (TV).

A gap between a top surface and a bottom surface of an organic light-emitting display apparatus may be sealed to protect the organic light-emitting device from external impact or impurities. To this end, the gap between the top surface and the bottom surface may be coated with a sealing member, and by hardening the sealing member, the top surface and the bottom surface are bonded. The lifespan and reliability of the display may be affected by the degree of adhesion between the top and bottom surfaces bonded by the sealing member.

SUMMARY

One or more embodiments of the present invention include an organic light-emitting display apparatus. Additional aspects will be set forth in part in the description that follows and, in part, will be apparent from the description, or may be learned by practice of the presented embodiments.

According to an embodiment of the present invention, an organic light-emitting display apparatus is provided. The organic light-emitting display apparatus includes a first substrate, a display unit defining an active area on the first substrate and including an insulating layer, a second substrate on the display unit, one or more signal lines outside the active area and on the insulating layer, and a sealant between the first substrate and the second substrate. The sealant bonds the first substrate and the second substrate, and covers at least a portion of the signal lines.

The display unit may include an organic light-emitting device including a first electrode, a second electrode, and an intermediate layer between the first electrode and second electrode. The signal lines may be electrically connected to the second electrode.

The organic light-emitting display apparatus may further include a passivation layer on the insulating layer, and a metal layer on the passivation layer and electrically connecting the second electrode and the signal lines.

The metal layer may include a same material as the first electrode.

The organic light-emitting display apparatus may further include a pixel-defining layer covering the metal layer and having a contact hole. The second electrode may be on the pixel-defining layer and contact the metal layer through the contact hole.

The pixel-defining layer may be separated from the sealant.

The insulating layer may have a first hole filled with the sealant.

According to another embodiment of the present invention, an organic light-emitting display apparatus is provided. The organic light-emitting display apparatus includes a first substrate, a display unit defining an active area on the first substrate and including an insulating layer, a second substrate on the display unit, one or more signal lines outside the active area and on the insulating layer, a pixel-defining layer on the signal lines and having a second hole, and a sealant between the first substrate and the second substrate. The sealant bonds the first substrate and the second substrate, covers at least a portion of the signal lines and at least a portion of the pixel-defining layer, and contacts the signal lines through the second hole.

The display unit may include an organic light-emitting device including a first electrode, a second electrode, and an intermediate layer between the first and second electrodes. The signal lines may be electrically connected to the second electrode.

The organic light-emitting display apparatus may further include a passivation layer on the insulating layer, and a metal layer on the passivation layer and electrically connecting the second electrode and the signal lines by contacting the signal lines.

The metal layer may include a same material as the first electrode.

The pixel-defining layer may be on the metal layer and have a contact hole. The second electrode may be on the pixel-defining layer and contact the metal layer through the contact hole.

The sealant may be separated from the second electrode.

The insulating layer may have a first hole filled with the sealant.

BRIEF DESCRIPTION OF THE DRAWINGS

These and other aspects of the present invention will become apparent and more readily appreciated from the following description of example embodiments, taken in conjunction with the accompanying drawings in which.

DETAILED DESCRIPTION

Figure 1:
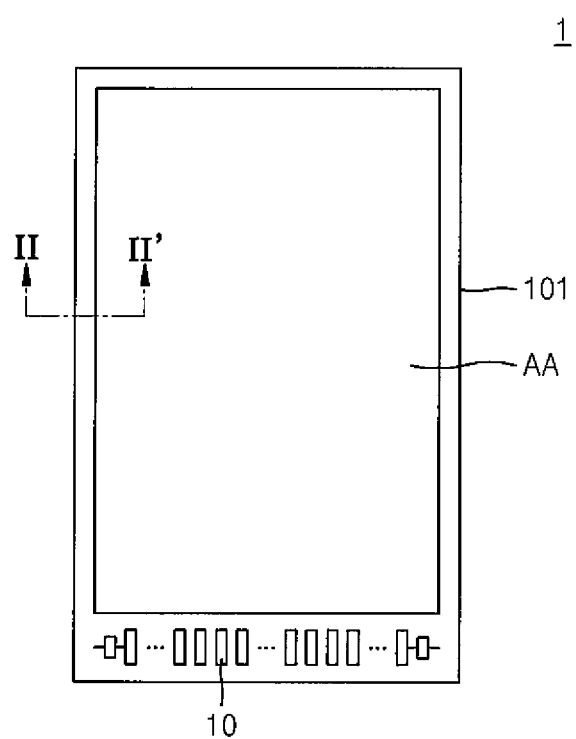
FIG. 1 is a schematic plan view of a part of an organic light-emitting display apparatus according to an embodiment of the present invention.

As the present invention allows for various changes and numerous embodiments, example embodiments will be illustrated in the drawings and described in detail in the written description. The attached drawings for illustrating described embodiments of the present invention are provided to better understand the present invention and aspects thereof. The present invention may, however, be embodied in many different forms and should not be construed as limited to the embodiments set forth herein.

Hereinafter, the present invention will be described in detail by describing example embodiments with reference to the attached drawings. Like reference numerals in the drawings denote like elements, and repeated descriptions may be omitted. While such terms as "first," "second," etc., may be used to describe various components, such components are not limited to the above terms. The above terms may be used to distinguish one component from another.

An expression used in the singular encompasses the expression of the plural, unless it has a clearly different meaning in the context. In the present specification, it is to be understood that terms such as "including", "having," and "comprising" are intended to indicate the existence of features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a component, such as a layer, a film, a region, or a plate, is referred to as being "on" another component, the component may be directly on the other component or intervening components may be present. Sizes of components in the drawings may be exaggerated for convenience of explanation, and embodiments of the present invention are not limited thereto.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Figure 2:
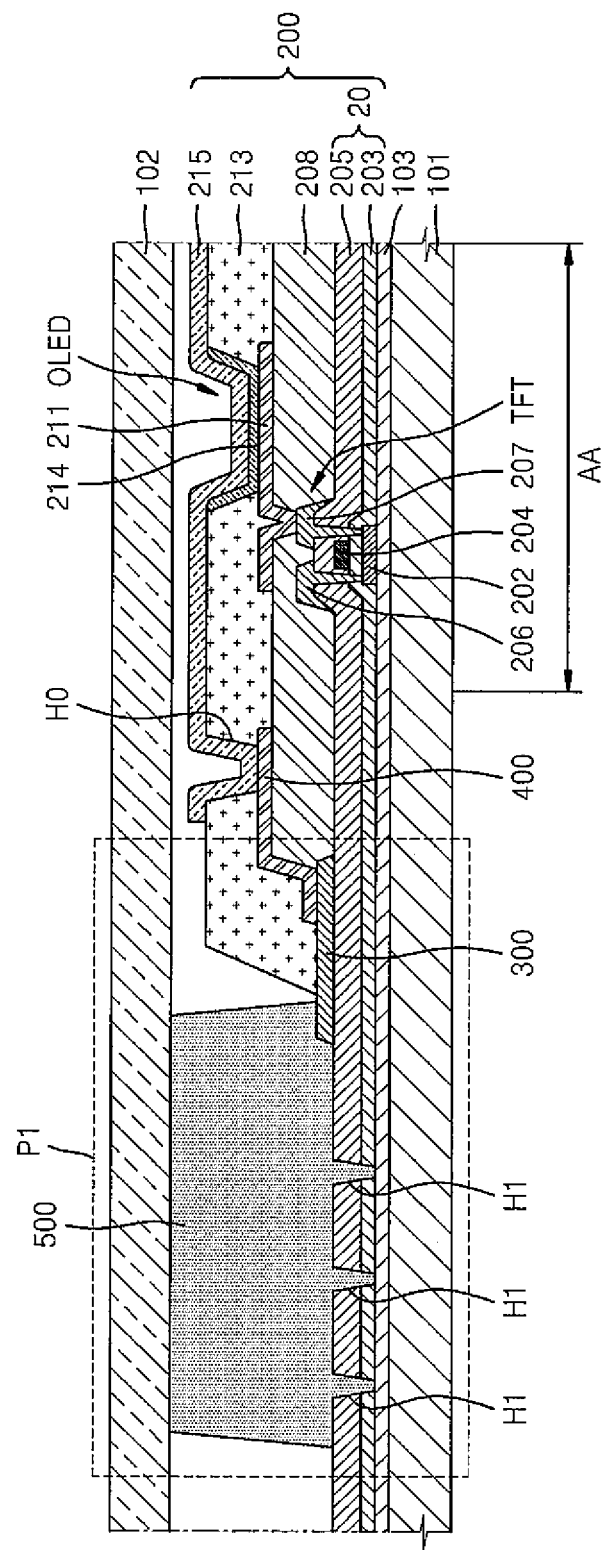
FIG. 2 is a cross-sectional view of the organic light-emitting display apparatus of FIG. 1, taken along a line II-II' of FIG. 1.
Figure 3:
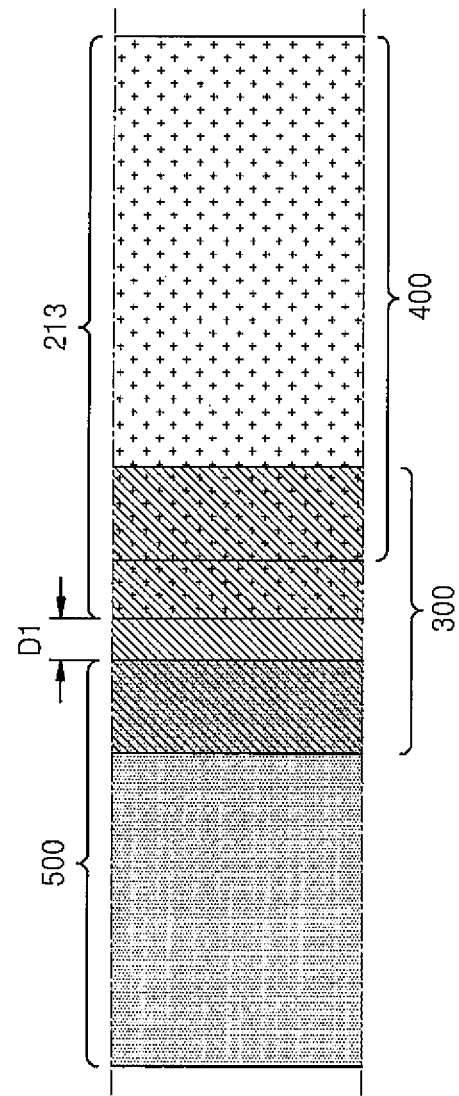
FIG. 3 is a plan view of an area P1 of FIG. 2.

FIG. 1 is a schematic plan view of a part of an organic light-emitting display apparatus 1 according to an embodiment of the present invention. FIG. 2 is a cross-sectional view of the organic light-emitting display apparatus 1 of FIG. 1, taken along a line II-II' of FIG. 1. FIG. 3 is a plan view of an area P1 of FIG. 2.

Referring to FIGS. 1 and 2, the organic light-emitting display apparatus 1 includes a first substrate 101, a display unit 200 defining an active area AA on the first substrate 101, one or more signal lines 300 (which may include, for example, signal lines for supplying signals or power lines for supplying power) arranged outside the active area AA, a second substrate 102 arranged on the display unit 200, and a sealant 500 bonding the first and second substrates 101 and 102.

The first substrate 101 may be a flexible substrate and may be formed of plastic having high heat resistance and durability. However, the first substrate 101 is not limited thereto and in other embodiments may be formed of various materials such as metal or glass.

The display unit 200 defines the active area AA on the first substrate 101. The display unit 200 includes an organic light-emitting diode (OLED) and a thin film transistor (TFT), which are electrically connected to each other. Pad units 10 are arranged around the bottom of the active area AA and may transmit electrical signals from a power supply or a signal generator to the active area AA. Hereinafter, the display unit 200 will be further described with reference to FIG. 2.

A buffer layer 103 may be formed on the first substrate 101. The buffer layer 103 may be formed on an entire surface of the first substrate 101, for example, on both the active area AA and regions surrounding the active area AA. The buffer layer 103 reduces or prevents penetration of impurities into the first substrate 101 and provides a flat surface to a top surface of the first substrate 101. The buffer layer 103 may be formed of various types of materials.

One or more insulating layers 20 may be formed on the first substrate 101. The insulating layers 20 may include a gate insulating layer 203 and an interlayer insulating layer 205.

The TFT may be formed on the buffer layer 103. The TFT may include an active layer 202, a gate electrode 204, a source electrode 206, and a drain electrode 207.

The active layer 202 may be formed of an inorganic semiconductor such as amorphous silicon and polysilicon, an organic semiconductor, or a compound semiconductor. The active layer 202 includes a source area, a drain area, and a channel area.

The gate insulating layer 203 is formed on the active layer 202. The gate insulating layer 203 may be formed to correspond to the entire surface of the first substrate 101. For example, the gate insulating layer 203 may be formed to correspond to both the active area AA and the regions surrounding the active area AA disposed on the first substrate 101. The gate insulating layer 203 insulates the gate electrode 204 from the active layer 202. The gate insulating layer 203 may be formed of organic materials or inorganic materials such as silicon nitride (SiNx) and silicon dioxide ($SiO_2$).

The gate electrode 204 is formed on the gate insulating layer 203. The gate electrode 204 may contain one or more materials such as gold (Au), silver (Ag), copper (Cu), nickel (Ni), platinum (Pt), palladium (Pd), aluminum (Al), molybdenum (Mo), or alloys such as an Al—Nd (neodymium) alloy or a Mo—W (tungsten) alloy. However, materials included in the gate electrode 204 are not limited thereto, and in other embodiments, the gate electrode 204 may be formed of one or more of various types of materials, depending on a structure of the gate electrode 204.

The interlayer insulating layer 205 is formed on the gate electrode 204. The interlayer insulating layer 205 may be formed to correspond to the entire surface of the first substrate 101. For example, the interlayer insulating layer 205 may be formed to correspond to the active area AA and the regions surrounding the active area AA.

The interlayer insulating layer 205 is arranged between the gate electrode 204 and the source electrode 206 and between the gate electrode 204 and the drain electrode 207 to insulate the gate electrode 204 from the source and drain electrodes 206 and 207. The interlayer insulating layer 205 may be formed of inorganic materials such as SiNx and $SiO_2$.

The signal lines 300 may be formed on the interlayer insulating layer 205. The signal lines 300 may be arranged outside the active area AA. The signal lines 300 may be electrically connected to a second electrode 215 and provide power to the second electrode 215. For example, the signal lines 300 may be a cathode power line (ELVSS). When the signal lines 300 are a cathode power line (ELVSS), the cathode power line (ELVSS) may be connected to cathode power having a voltage that is lower than a common power supply voltage, for example, the cathode power may have a ground voltage or a negative voltage. The signal lines 300 may be formed of the same material and formed through the same process as the source electrode 206 or the drain electrode 207.

One or more first holes H1 may be formed in the insulating layer 20. The first holes H1 may be arranged outside the active area AA. There may be a plurality of first holes H1. As the first holes H1 may be formed in the insulating layer 20 and the sealant 500 may be formed on the insulating layer 20 by filling the first holes H1, contact area of the sealant 500 may be increased. Accordingly, the adhesion of the first substrate 101 and the second substrate 102 may be improved.

The source electrode 206 and the drain electrode 207 are formed on the interlayer insulating layer 205. In particular, the interlayer insulating layer 205 and the gate insulating layer 203 are formed (for example, with contact holes) to expose the source area and the drain area of the active layer 202, and the source electrode 206 and the drain electrode 207 are formed to contact the exposed source area and drain area, respectively, of the active layer 202.

FIG. 2 shows a top-gate-type TFT that sequentially includes the active layer 202, the gate electrode 204, the source electrode 206, and the drain electrode 207. However, the present invention is not limited thereto, and in other embodiments, the gate electrode 204 may be arranged under the active layer 202.

The TFT is electrically connected to the OLED to operate the OLED, and is covered and protected by a passivation layer 208. The passivation layer 208 may include an inorganic insulating layer and/or an organic insulating layer. The passivation layer 208 may cover a portion of the signal lines 300.

A metal layer 400 may be formed on the passivation layer 208 and may contact the signal lines 300. Since the metal layer 400 contacts the signal lines 300, the second electrode 215 and the signal lines 300 may be electrically connected. The metal layer 400 may be formed of the same material as and formed through the same process as a first electrode 211.

The OLED is formed on the passivation layer 208. The OLED may include the first electrode 211, an intermediate layer 214, and the second electrode 215.

The first electrode 211 is formed on the passivation layer 208. In further detail, the passivation layer 208 may be formed (for example, with a contact hole) to expose a set or predetermined portion of the drain electrode 207 in order not to cover an entire portion thereof, and the first electrode 211 may be formed to be connected to the exposed portion of the drain electrode 207. In the embodiment of FIG. 2, the first electrode 211 may be a reflective electrode. The second electrode 215 may be arranged to face the first electrode 211 and may be a transparent or translucent electrode. Therefore, the second electrode 215 may transmit light that is emitted from an organic emission layer included in the intermediate layer 214. That is, the light emitted from the organic emission layer is directly reflected or is reflected by the first electrode 211 formed as a reflective electrode, and then may be emitted to the second electrode 215.

However, the organic light-emitting display apparatus 1 in the present invention is not limited to a top emission type and, in other embodiments, may be a bottom emission type in which the light emitted from the organic emission layer is emitted to the first substrate 101. In this case, the first electrode 211 may be formed as a transparent or translucent electrode, and the second electrode 215 may be formed as a reflective electrode. In still other embodiments, the organic light-emitting display apparatus 1 may be a dual emission type in which the light is emitted to top and bottom surfaces of the organic light-emitting display apparatus 1.

A pixel-defining layer 213 is formed of an insulating material on the first electrode 211. The pixel-defining layer 213 may be formed on the signal lines 300 and may cover the metal layer 400. In the pixel-defining layer 213, a contact hole H0 (or plurality of contact holes) may be formed. The second electrode 215 is formed on the pixel-defining layer 213 and may contact the metal layer 400 through the contact hole H0. The second electrode 215 may be electrically connected to the signal lines 300 through the metal layer 400.

The pixel-defining layer 213 exposes a set or predetermined portion of the first electrode 211, and the intermediate layer 214 is disposed on the exposed portion of the first electrode 211. The intermediate layer 214 includes the organic emission layer. The intermediate layer 214 may further include at least one of a hole injection layer (HIL), a hole transport layer, an electron transport layer, and an electron injection layer. However, the present invention is not limited thereto, and in other embodiments, the intermediate layer 214 may further include various functional layers.

The second substrate 102 is arranged on the second electrode 215. The second electrode 215 may be a flexible substrate and may be formed of plastic having high heat resistance and durability. However, the second electrode 215 is not limited thereto, and in other embodiments may be formed of various materials such as metal or glass.

The sealant 500 is disposed between the first and second substrates 101 and 102 to bond the substrates. The sealant 500 may be formed outside the active area AA. The sealant 500 may include frit. The sealant 500 may function as a main barrier that reduces or prevents organic materials of the display unit 200 from being deformed due to impurities such as oxygen and moisture from outside.

The sealant 500 may be formed on the insulating layer 20. The sealant 500 may be formed by filling the first holes H1 formed in the insulating layer 20. Accordingly, the adhesion of the first substrate 101 and the second substrate 102 may be improved.

The sealant 500 may cover at least some portion of the signal lines 300. Accordingly, an area where the sealant 500 is formed is increased to an area where the signal lines 300 are formed. Therefore, the adhesion of the first substrate 101 and the second substrate 102 may be improved. If the sealant 500 is formed on the pixel-defining layer 213, the adhesion of the sealant 500 and the pixel-defining layer 213 may not be strong enough, and thus, the sealant 500 may separate from the pixel-defining layer 213. Accordingly, the sealant 500 may be formed to be separate from the pixel-defining layer 213 (such as being separated from the pixel-defining layer 213 by a set or predetermined distance).

Hereinafter, the area where the sealant 500 is formed will be described in further detail with reference to FIG. 3.

Referring to FIG. 3, the sealant 500 is formed by covering at least some portion of the signal lines 300. Some portion of the signal lines 300 contacts the metal layer 400. The metal layer 400 is covered with the pixel-defining layer 213. As the sealant 500 is formed by covering at least some portion of the signal lines 300, the area where the sealant 500 is formed is increased. Thus, the adhesion of the first and second substrates 101 and 102 is improved, and the reliability of the organic light-emitting display apparatus 1 is improved. As the sealant 500 is separate from the pixel-defining layer 213 (for example, the sealant 500 may be separated from the pixel-defining layer 213 by a set or predetermined distance D1), contact defects that occur when the sealant 500 is formed on the pixel-defining layer 213 may be prevented.

Figure 4:
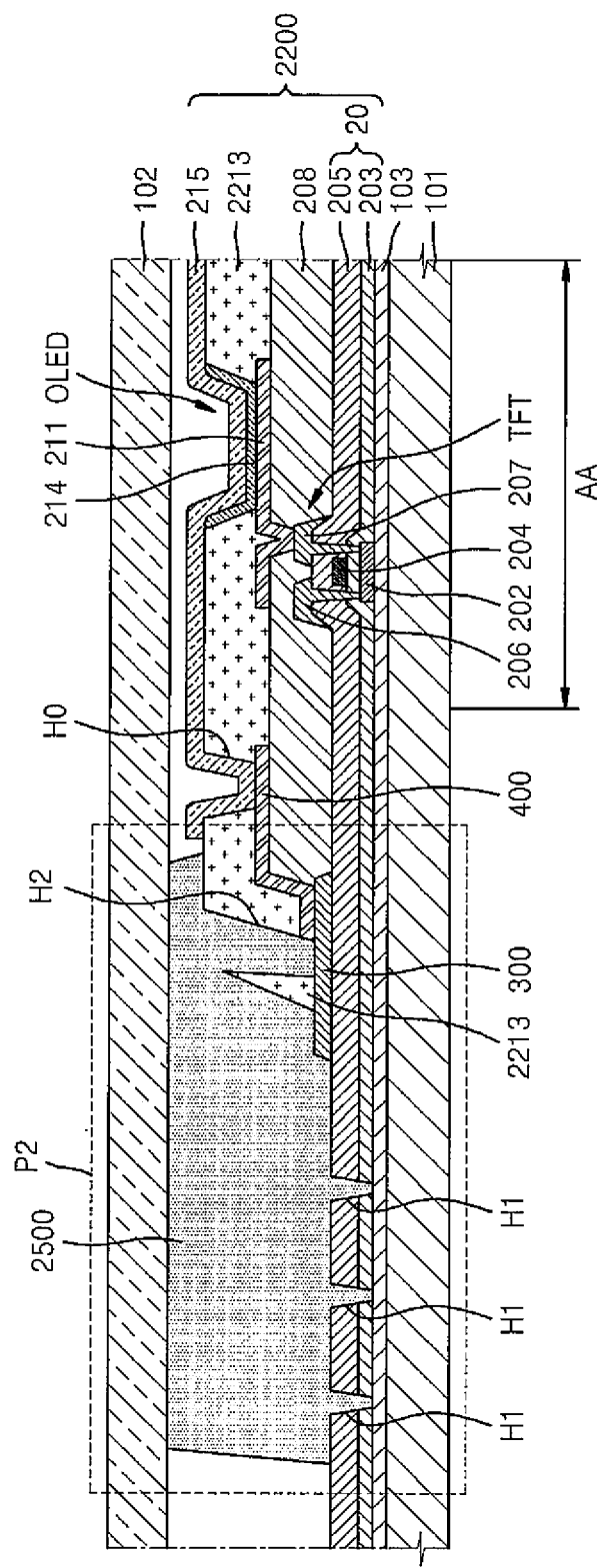
FIG. 4 is a schematic cross-sectional view of a part of an organic light-emitting display apparatus according to another embodiment of the present invention.
Figure 5:
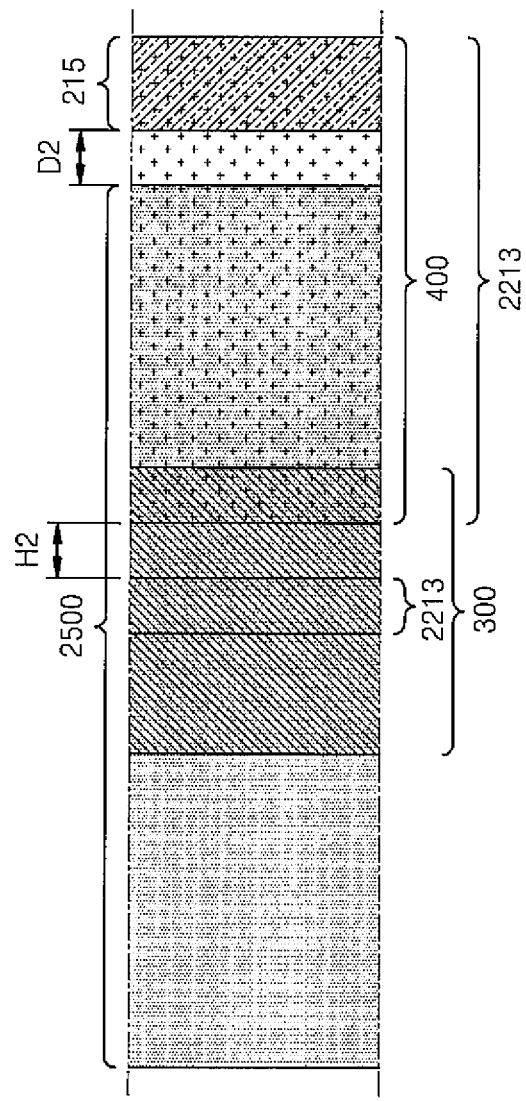
FIG. 5 is a plan view of an area P2 of FIG. 4.

FIG. 4 is a schematic cross-sectional view of a part of an organic light-emitting display apparatus according to another embodiment of the present invention. FIG. 5 is a plan view of an area P2 of FIG. 4.

The embodiment of FIGS. 4 and 5 will be described in comparison with the embodiment of FIGS. 2 and 3. Like reference numerals in the drawings denote like elements, and repeated descriptions may be omitted.

Referring to FIG. 4, the organic light-emitting display apparatus includes a first substrate 101, a display unit 2200 that defines an active area AA on the first substrate 101, one or more signal lines 300 that are formed outside the active area AA, a second substrate 102 that is arranged on the display unit 2200, and a sealant 2500 that bonds the first substrate 101 and the second substrate 102.

A pixel-defining layer 2213 is formed of an insulating material on a first electrode 211. The pixel-defining layer 2213 is also formed on a metal layer 400. A contact hole H0 (or plurality of contact holes) is formed in the pixel-defining layer 2213. A second electrode 215 is formed on the pixel-defining layer 2213 and may contact the metal layer 400 through the contact hole H0. The second electrode 215 may be electrically connected to the signal lines 300 through the metal layer 400.

A second hole H2 (or plurality of second holes) may be formed in the pixel-defining layer 2213 corresponding to the signal lines 300. Accordingly, some portion of the signal lines 300 may be exposed.

The sealant 2500 covers at least some portion of the signal lines 300. Thus, an area where the sealant 2500 is formed is increased by an area where this portion of the signal lines 300 is formed. Therefore, the adhesion of the first substrate 101 and the second substrate 102 may be improved. Furthermore, the sealant 2500 may be formed on the pixel-defining layer 2213. Through the second hole H2, the sealant 2500 and the signal lines 300 may further contact each other. Thus, although the adhesion of the sealant 2500 and the pixel-defining layer 2213 may not be strong enough, the area where the sealant 2500 is formed may be increased by a portion of an area where the pixel-defining layer 2213 is formed. Accordingly, the adhesion of the first substrate 101 and the second substrate 102 may be improved. The sealant 2500 may be separate from the second electrode 215 in order to prevent damage to the second electrode 215.

Hereinafter, the area where the sealant 2500 is formed will be described in further detail with reference to FIG. 5.

Referring to FIG. 5, the sealant 2500 is formed by covering at least some portion of the signal lines 300. Some portion of the signal lines 300 contacts the metal layer 400. The pixel-defining layer 2213 is formed on the metal layer 400, and the second hole H2 is formed in the pixel-defining layer 2213 (for example, corresponding to the signal lines 300). Therefore, the sealant 2500 may contact the signal lines 300 through the second hole H2. Accordingly, the area where the sealant 2500 is formed may be increased by a portion of the pixel-defining layer 2213.

As the area where the sealant 2500 is formed is increased, the adhesion of the first and second substrates 101 and 102 may be improved, and thus, the reliability of the organic light-emitting display apparatus may be improved. The sealant 2500 may be separate from the second electrode 215 by a set or predetermined distance D2. As the sealant 2500 is separate from the second electrode 215, damage to the second electrode 215, which occurs when the sealant 2500 contacts the second electrode 215, may be prevented.

As described above, according to the one or more of the above embodiments of the present invention, the lifespan and reliability of an organic light-emitting display apparatus may be improved by improving the adhesion of top and bottom substrates, namely, the first and second substrates 101 and 102, of the organic light-emitting display apparatus.

It should be understood that the exemplary embodiments described herein should be considered in a descriptive sense only and not for purposes of limitation. Descriptions of features or aspects within each embodiment should be considered as generally available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
  a first substrate;
  a display unit defining an active area on the first substrate and comprising a thin film transistor in the active area, the thin film transistor comprising an active layer, a gate electrode, a source electrode, and a drain electrode;
  an interlayer insulating layer between the gate electrode and the source and drain electrodes;
  a second substrate on the display unit;
  a cathode power line outside the active area and on the interlayer insulating layer, the cathode power line being between the interlayer insulating layer and the second substrate; and
  a sealant between the first substrate and the second substrate and bonding the first substrate and the second substrate,
  wherein the interlayer insulating layer defines at least two first holes outside the active area, and the at least two first holes are filled with the sealant.

2. The organic light-emitting display apparatus of claim 1, wherein the display unit further comprises an organic light-emitting device comprising a first electrode, a second electrode, and an intermediate layer between the first electrode and the second electrode, and wherein the cathode power line is electrically connected to the second electrode.

3. The organic light-emitting display apparatus of claim 2, wherein
  the thin film transistor is electrically connected to the first electrode,
  the cathode power line comprises a same material as the source electrode and the drain electrode.

4. The organic light-emitting display apparatus of claim 3, further comprising
  a gate insulating layer between the active layer and the gate electrode.

5. The organic light-emitting display apparatus of claim 2, wherein the sealant is separated from the second electrode.

6. The organic light-emitting display apparatus of claim 2, further comprising:
  a passivation layer on the interlayer insulating layer; and
  a metal layer on the passivation layer and electrically connecting the second electrode and the cathode power line.

7. The organic light-emitting display apparatus of claim 6, wherein the passivation layer covers at least a portion of the cathode power line.

8. The organic light-emitting display apparatus of claim 7, wherein the passivation layer covers at least an edge portion of the cathode power line between the cathode power line and the metal layer.

9. The organic light-emitting display apparatus of claim 6, wherein the metal layer comprises a same material as the first electrode.

10. The organic light-emitting display apparatus of claim 6, further comprising a pixel-defining layer covering the metal layer and having a contact hole, wherein the second electrode is on the pixel-defining layer and contacts the metal layer through the contact hole.

11. The organic light-emitting display apparatus of claim 10, wherein the pixel-defining layer is separated from the sealant.

12. The organic light-emitting display apparatus of claim 11, wherein the pixel-defining layer covers at least a portion of the cathode power line exposed between the sealant and the metal layer.

13. The organic light-emitting display apparatus of claim 10, wherein
the pixel-defining layer has a second hole, and
the sealant covers at least a portion of the pixel-defining layer and contacts the cathode power line through the second hole.

14. The organic light-emitting display apparatus of claim 4, wherein the gate insulating layer defines at least two third holes filled with the sealant, and
wherein each of the at least two third holes corresponds to each of the at least two first holes.

* * * * *